United States Patent [19]
Rupprecht et al.

[11] 3,773,571

[45] Nov. 20, 1973

[54] PREPARATION OF SEMICONDUCTOR TERNARY COMPOUNDS OF CONTROLLED COMPOSITION BY PREDETERMINED COOLING RATES

[75] Inventors: Hans S. Rupprecht, Yorktown Heights; Jerry M. Woodall, Putnam Valley, both of N.Y.

[73] Assignee: International Business Machines Corporation, Armonk, N.Y.

[22] Filed: June 15, 1967

[21] Appl. No.: 646,315

[52] U.S. Cl. .............. 148/172, 23/301 SP, 117/201, 148/1.5, 148/171, 252/62.3 GA

[51] Int. Cl. .............. H01l 7/38, B01j 17/20

[58] Field of Search .............. 148/171, 172, 1.5, 148/1.6, 177; 117/201; 23/204, 301; 252/62.3

[56] References Cited

UNITED STATES PATENTS

| | | | |
|---|---|---|---|
| 3,158,512 | 11/1964 | Nelson et al. | 148/1.5 |
| 3,278,342 | 10/1966 | John et al. | 148/1.6 |
| 3,351,502 | 11/1967 | Rediker | 148/177 |
| 3,411,946 | 11/1968 | Tramposch | 117/201 |
| 3,447,976 | 6/1969 | Faust et al. | 148/1.5 |

OTHER PUBLICATIONS

Stambaugh, E. P. et al., Bureau of Ships, Contract Nos.–77,034, 9th Bimonthly Report, Sept., 1960.

Stambaugh, E. P. et al. "Growth of Refractory III–V Compounds and Alloys From Solution" in Metallurgy of Elemental and Compound Semiconductors, R. O. Grubel, Editor, Interscience, New York (1961).

Nelson, H., RCA Review, Dec. 1963, pp. 603–615, (Vol. 24).

Shang, D. C., IBM Technical Disclosure Bulletin, Vol. 11, No. 7, Dec. 1968

Rupprecht, H. et al. applied Physics Letters, Vol. 11, No. 3, pp. 81–83 (1967)

Nelson, H., RCA Review, 24, 603 (1963) pp. 603–615

Pilkuhn, M. H. et al., J. Applied Physics, 38, pp. 5–10 (1967).

Rupprecht, H., "New Aspects of Solution Regrowth in the Device Technology of The Gallium Arsenide" in Proceedings of the 1966 Symposium on GaAs, in Reading, Editor: Institute of Physics and Physical Soc., Paper No. 9, 57 (1966).

Black, J. F. et al., J. Electrochemical Soc., 113, 249 (1966).

Ku, S. M. et al., J. Applied Physics, 37, 3733 (1966).

*Primary Examiner*—Hyland Bizot
*Assistant Examiner*—W. G. Saba
*Attorney*—Hanifin and Jancin and Bernard N. Wiener

[57] ABSTRACT

Semiconductor ternary compounds are prepared by liquid phase epitaxy by using control of the cooling rate to control the crystalline composition. In particular, $Ga_{1-x}Al_xAs$ is grown on a GaAs substrate and has a homogeneous composition. This is accomplished by cooling a melt of Ga and Al saturated with GaAs in $Al_2O_3$ crucible using a single crystalline wafer of GaAs as the substrate. Critical parameters are an excess of GaAs, the Al/Ga ratio, the growth temperature, and the cooling rate. Electroluminescent diodes made from the $Ga_{1-x}Al_xAs$ have relatively high quantum efficiencies, e.g., 3.3 percent when emitting light of energy 1.70 electron volts through an epoxy dome with a matching index of refraction.

Illustratively, for the electroluminescent diodes with 3.3 percent quantum efficiency, exemplary parameters included a melt composition of 20 grams of Ga, 50 milligrams of Al, growth rate of 1°C per minute over a temperature range of 950°C to 920°C for n-type dopant of 5 milligrams of Te and an additional 50 milligrams of Zn from 920°C to 860°C for counter doping to p-type. Further, a GaAs - $Ga_{1-x}Al_xAs$ heterojunction is obtained if the cooling rate is changed abruptly from 1°C per minute to greater than 10°C per minute.

19 Claims, 10 Drawing Figures

United States Patent [19]
Rupprecht et al.
[11] 3,773,571
[45] Nov. 20, 1973
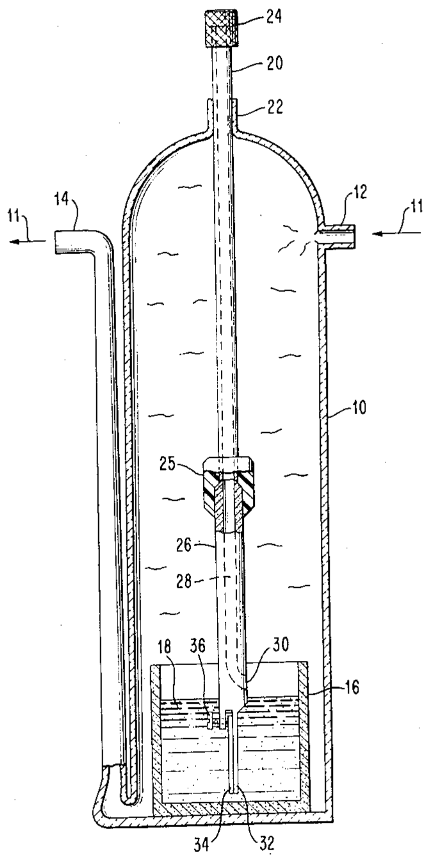

INVENTORS
HANS S. RUPPRECHT
JERRY M. WOODALL
BY
Bernard N. Wiener
ATTORNEY

PREPARATION OF SEMICONDUCTOR TERNARY COMPOUNDS OF CONTROLLED COMPOSITION BY PREDETERMINED COOLING RATES

BACKGROUND OF INVENTION

This invention relates generally to preparation of semiconductor multicomponent compounds with more than two components, e.g., ternary compounds, and it relates more particularly to method for preparation of such compounds by liquid phase epitaxy and to electroluminescent p-n junctions in products produced thereby.

The prior art has investigated preparation of semiconductor binary compounds by liquid phase epitaxy of which the following literature provides illustrative background material:

a. "Epitaxial Growth from the Liquid State and its Application to the Fabrication of Tunnel and Laser Diodes" H. Nelson, RCA Review, 24, 603 (1963).

b. "Optical and Electrical Properties of Epitaxial and Diffused GaAs Injection Lasers" M.H. Pilkuhn et al., Journal of Applied Physics, 38, 5 (1967).

c. "New Aspects of Solution Regrowth in the Device Technology of the Gallium Arsenide" H. Rupprecht, Proceedings of the 1966 Symoposium on GaAs in Reading, Editor: Institute of Physics and Physical Society, Paper No. 9, 57 (1966).

There have also been studies made in the prior art of growth of semiconductor ternary compounds by vapor phase epitaxy of which the following are illustrative literature citations:

a. "Preparation and Properties of AlAs-GaAs Mixed Crystals" J.F. Black et al., Journal of the Electrochemical Society, 113, 249 (1966).

b. "Injection Electroluminescence in $(Al_xGa_{1-x})$ As Diodes of Graded Energy Gap" S.M. Ku et al., Journal of Applied Physics, 37, 3,733 (1966).

SUMMARY OF INVENTION

It is an object of this invention to prepare semiconductor multicomponent compounds with more than two components, e.g., ternary compounds, and p-n junction devices related thereto.

It is another object of this invention to prepare the semiconductor ternary compound $Ga_{1-x}Al_xAs$ and $Ga_{1-x}Al_xP$ and electroluminescence p-n junctions related thereto.

It is another object of this invention to control the homogeneity of a layer of a semiconductor ternary compound during its growth by liquid phase epitaxy through control of the rate of cooling.

It is another object of this invention to establish a heterojunction having a layer of a semiconductor binary compound adjacent to a layer of a semiconductor ternary compound during liquid phase epitaxial growth of the layers.

It is another object of this invention to provide a heterojunction suitable for use in an optically coupled transistor by rapidly changing the cooling rate during growth by liquid phase epitaxy of the semiconductor ternary compound system $Ga_{1-x}Al_xAs$ with a resultant layer of GaAs adjacent to a layer of $Ga_{1-x}Al_xAs$.

Through the practice of this invention, semiconductor ternary compounds are grown from solution by liquid phase epitaxy with the homogeneity of composition being determined primarily by control of the cooling rate when the solution or melt composition is maintained essentially constant. By maintaining the cooling rate constant, a layer is grown with essentially uniform composition. By rapidly changing the cooling rate from one level to another level, in interface is established between two crystalline structures each with a different but essentially uniform composition. By gradually varying the cooling rate of the layers during growth a crystalline structure is produced with differential change in composition directly related to the nature of the change in cooling rate. By doping and counter doping sequentially with semi-conductor dopants at an interface in the growing crystalline structure, there is provided a p-n junction at that interface.

Among the advantages achieved through the practice of this invention is a procedure for growing a single crystalline ternary compound with uniform composition of high purity. Another advantage achieved through the practice of this invention is a procedure for growing single crsytalline semiconductor ternary compounds. Another advantage achieved through the practice of this invention is a procedure for growing an electroluminescent p-n junction in single crystalline ternary compound $Ga_{1-x}Al_xAs$ with relatively high quantum efficiency of high energy emission.

The foregoing and other objects, features and advantages of the invention will be apparent from the following more particular description of preferred embodiments of the invention, as illustrated in the accompanying drawings.

BRIEF DESCRIPTION OF DRAWINGS

FIG. 8 is a graph of data showing the electroluminescent peak energy at room temperature as a function of the Al/Ga weight ratio in the melt at equilibrium for components Ga, Al and As.

BRIEF DESCRIPTION OF EMBODIMENTS OF INVENTION

In the practice of one aspect of this invention by counter doping during the growth of the semiconductor ternary compound, a p-n junction is provided in an otherwise homogeneous material. Illustratively, a $Ga_{1-x}Al_xAs$ layer is grown on the (100) face of GaAs with a melt composition of 20 gm Ga and 0.1–0.2 gm Al, plus excess GaAs during a cooling rate set between 0.5°C/min. to 0.1°C/min. over the temperature range 1,000°C to 860°C. Dopants for the n- and p- type sides of the junction are Te and Zn, respectively.

Efficient visible electroluminesense is observed at room temperature in the $Ga_{1-x}Al_xAs$ diodes prepared by liquid phase epitaxy. Illustrative diodes emit at 1.7 eV (7,300A) with a quantum efficiency of 1.2 percent at 100 A/cm$^2$, which increases to 3.3 percent when the diodes are covered by an epoxy dome. The emission intensity is superlinear for current densities below 50A/cm$^2$, and linear for higher currents. For low current values the current varies as exp ($eV/\beta kT$) with $\beta \approx 2$. The diodes have a turn-on time of 60 ns. Capacitance measurements indicate a graded junction with an impurity gradient of $2 \times 10^{22}cm^{-4}$. The measured diodes are about $5 \times 10^{-4}cm^2$ in area. The GaAs substrate is lapped off before the efficiency measurements were made. A dot contact is made to the n-type side, and the series resistance is rather high in the order of 56Ω. Approximately 14 percent the photons emitted at room temperature, and 26 percent at 77°K, lie in lower energy peaks in the infrared, the balance lying in the red peak, which has shifted to 1.79 eV at 77°K.

In the practice of another aspect of this invention, the GaAs ratio of a layer of $Ga_{1-x}Al_xAs$ as grown from solution by liquid phase epitaxy is controlled by control of both the melt composition and the cooling rate. First, the layer is grown as $Ga_{1-x}Al_xAs$ at a cooling rate of approximately 1°C/min. Second, the cooling rate is rapidly changed to greater than 10°C/min. The composition of the layer is GaAs. By providing n-type layers of $Ga_{1-x}Al_xAs$ adjacent to a layer of GaAs and then doping the outer layer p-type, either by counter doping during growth or by diffusion after growth, the basic structure for an optically coupled transistor configuration is provided.

DESCRIPTION OF EMBODIMENTS OF THE INVENTION

Figure 1:
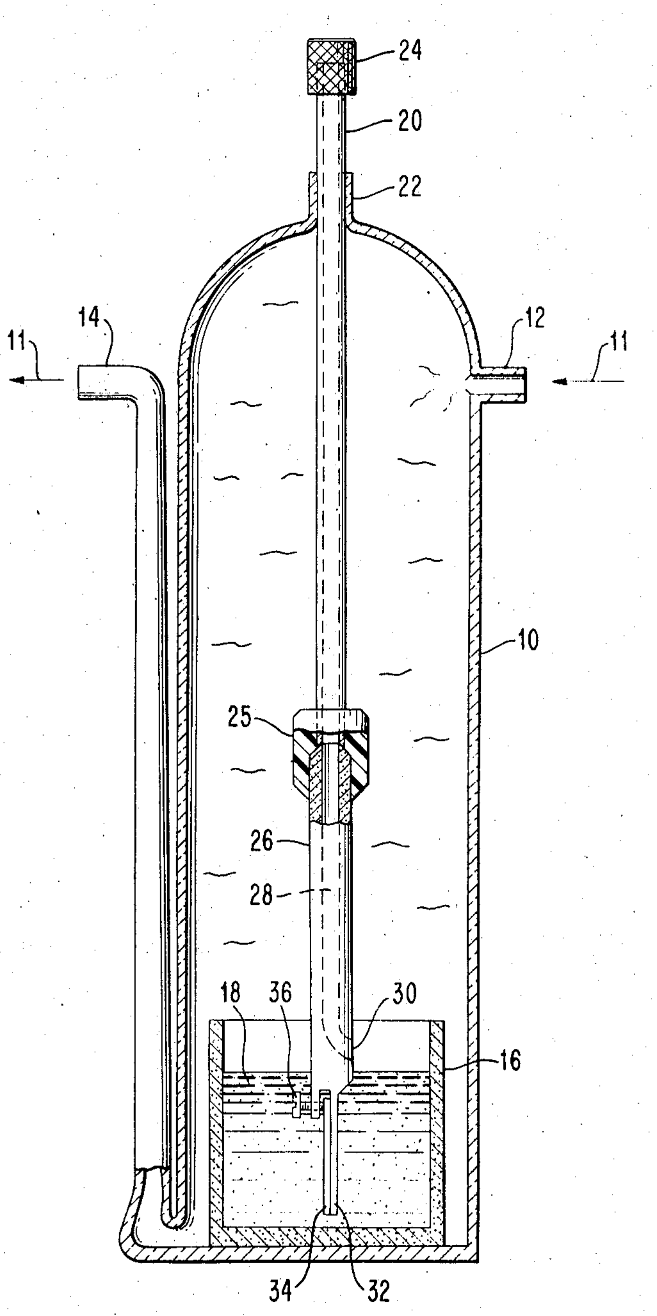
FIG. 1 is a line drawing showing a sectional view of apparatus useful for effecting growth by liquid phase epitaxy of semiconductor ternary compounds.

The practice of this invention for several preferred embodiments thereof will now be presented with reference to the drawings of which FIG. 1 is a schematic diagram of apparatus suitable for growing a semiconductor crystal compound by liquid phase epitaxy. Quartz chamber 10 is provided within which the preparation of the compound is obtained. Orifice 12 is the inlet for a high purity inert gas used during the steps of the procedure according to this invention. After having served its intended purpose during the steps of the procedure of this invention, the inert gas introduced via orifice 12 exits from chamber 10 via orifice 14. A crucible 16 of $Al_2O_3$ is established within chamber 10, the components of a ternary compound, e.g., Ga, Al, and As are established as a liquid in equilibrium at a given temperature in the crucible 16. The heat source whereby the liquid 18 is raised in temperature and the heat sink whereby the temperature of liquid 18 is lowered are not shown. For convenience a vertical tubular electric furnace with temperature control can be used for both the heat source and heat sink, and the ambient environment providing sufficient temperature for cooling. Quartz tube 20 is introduced into chamber 10 via orifice 22. Removable cap 24 is placed on top of tube 20. Quartz tube 20 is connected by coupling 25 to graphite piece 26 which has a tube portion 28 therein connecting to the tube portion of tube 20. Orifice 30 of tube 28 exits just about the surface of liquid 18. Graphite portion 26 is machined to have a lower extending portion 32 upon which a solid substrate, e.g., single crystalline GaAs layer 34 is affixed by the thrust of screw 36.

A crucible 16 is selected which does not react with the components of the liquid 18 at the temperature of growth of the crystalline compound according to the practice of the invention. A suitable pressure of the inert gas 11 introduced at orifice 12 is maintained in chamber 10 to inhibit vapor formation of highly volatile components in the liquid 18 and further to preclude any undesirable reactions in the liquid 18 with contaminants that might otherwise be introduced into chamber 10. Illustrative inert gases suitable for the gas 11 are argon and helium. Another gas which is inert for the liquid 18 consisting of the components Ga, Al and As, is high purity forming gas, e.g., 10% $H_2$ + 90% $N_2$.

In an illustrative operation for growing a layer of $Ga_{1-x}Al_xAs$, crucible 16 is loaded with the components Ga, Al and As for a suitable liquid in equilibrium at a given temperature, e.g., 20 grams Ga, 0.005 grams Al (generally, Al can be from 0 to 0.200 grams), and excess of pure GaAs, e.g., 3.5 grams GaAs. When required, a dopant of one conductivity type is established in a predetermined concentration in the liquid 18, e.g., for an n-type semiconductor, prepared with the foregoing components, 0.005 grams Te is introduced into liquid 18. The crucible 16 is introduced in chamber 10 through a port not shown. The quartz tube 20, graphite portion 26 are coupled via connection 27 together with a substrate 34, e.g., GaAs, with the surface main face perpendicular to the < 100 > crystalline direction, affixed to the extending portion 32 and is established in chamber 10 above liquid 18. The substrate 34 may be doped when it is to serve an electrical purpose, e.g., GaAs doped n = $2 \times 10^{18}$ Sn atoms/cc to serve as an electrical contact in an ultimate device. The chamber 10 is flushed with inert gas 11 and a suitable pressure thereof is maintained in the chamber. In one illustrative operation for heating the liquid 18 the entire chamber 10 is placed into an isothermal furnace maintained at a given temperature for equilibrium of the liquid 18, e.g., 960°C. A suitable time is awaited so that the liquid 18 achieves equilibrium at the given isothermal temperature, e.g., 5 minutes. Substate 34 is then immersed in the liquid 18, a period of time is allowed to elapse so that the substrate 34 achieves equilibrium with the liquid 18 at the operational temperature. It has proven to be convenient to lower the temperature of liquid 18 slightly before introducing the substrate 34, e.g., lowering by 20°C, and after the substrate 34 has been introduced into the liquid 18 to raise the temperature somewhat, e.g., by 10°, so that the temperature at which the initiation of the growth is to occur is at a preselected temperature, e.g., 950°C. The raising of the temperature by 10°C also results in good wetting of the melt to the GaAs substrate 34. For a uniform composition of a grown layer of $Ga_{1-x}Al_xAs$ on substrate 34 a particular cooling rate is selected, e.g., from 0.5°C to 1.0°C per minute, and the cooling at this rate is continued until a required layer of thickness of the crystalline compound is obtained.

When it is desired to grow a p-n semiconductor junction in the growing layer, the initial liquid is doped with a dopant of one conductivity type, e.g., 0.005 grams Te, and after a particular thickness has been obtained, e.g., cooling from 950°C to 915°C, the cooling is stopped and a portion of a p-type dopant, e.g., Zn, is introduced via cap 24 to tube 20, and it falls through orifice 30 into liquid 18. The temperature of the liquid 18 is then raised somewhat, e.g., to 920°C, and an appropriate period of time is allowed to elapse, e.g., 5 minutes, to obtain equilibrium in the liquid 18. Thereafter cooling is continued at the previous preselected cooling rate, and finally the cooling is terminated when a desired thickness of the resultant crystalline layer is obtained, e.g., when the temperature has reached 860°C.

By abruptly increasing the cooling rate over the cooling rate selected as above for a layer of $Ga_{1-x}Al_xAs$ with uniform composition, e.g., to greater than 10°C per minute, essentially pure GaAs is deposited by liquid phase epitaxy and there is established a heterojunction of $Ga_{1-x}Al_xAs$ and GaAs.

Further, by substituting GaP for GaAs in the liquid 18 and using a substrate of GaP with a temperature range between 1,140°C and 1,030°C, desirable layers of $Ga_{1-x}Al_xP$ are grown by liquid phase epitaxy.

It has been discovered for the practice of this invention that a multicomponent compound with more than two components, e.g., ternary compound, can be grown in both polycrystalline form and single crystalline form with predetermined composition through control of the cooling rate when the percentages of the components in the liquid are maintained at essentially constant values. As will be indicated at greater length in a following theoretical section, this control of the composition of the multicomponent system is not expected from consideration of relevant binary phase diagrams.

Figure 2:
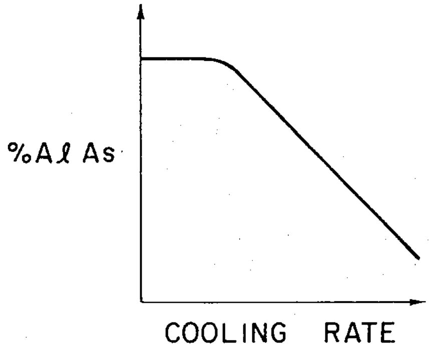
FIG. 2 is an idealized graph illustrating the percent AlAs present in a layer of $Ga_{1-x}Al_xAs$ by practice of this invention versus the cooling rate.
Figure 3:
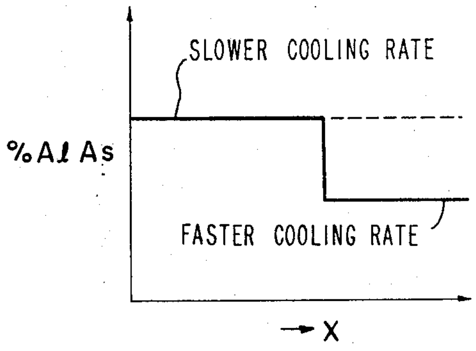
FIG. 3 is an idealized graph illustrating the percent AlAs present in a layer of $Ga_{1-x}Al_xAs$ by the practice of this invention versus distance in the layer from the initial growth interface for two different cooling rates.

Illustratively, FIGS. 2 and 3 present idealized graphs of the experimental verifications of the foregoing discovery. In FIG. 2 the percentage AlAs in a liquid solution in equilibrium of Ga, Al and As with respect to cooling rate has an essentially horizontal portion for equilibrium cooling and a linear change as the cooling rate is changed thereafter. In FIG. 3 the percentage AlAs in a liquid solution in equilibrium at a given temperature is plotted versus distance from the initial growth interface at the substrate. Two levels are shown in the idealized curve of FIG. 3. For a slower cooling rate, a higher percentage AlAs in the grown layer and for a faster cooling rate, there is a lesser percentage AlAs in the grown layer.

Figure 4:
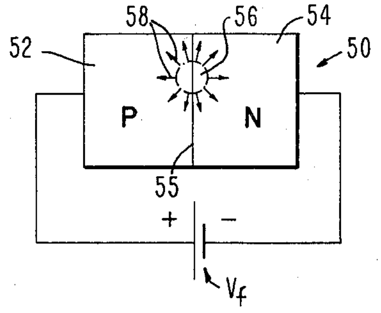
FIG. 4 illustrates the recombination radiation emanating from p-n junction in semiconductor element when the junction is forward biased.

FIG. 4 illustrates the generation of recombination radiation at a p-n junction of a forward biased semiconductor element. A semiconductor element 50 has a p-type region 52 and an n-type region 54, with a p-n junction 55 therebetween. The positive terminal of a potential source $V_f$ is shown connected to the p-type region 52 and its negative terminal is shown connected to the n-type region 54, thereby forward biasing semiconductor element 50. An illustrative region 56 of the p-n junction is shown in circular form. Emanating from region 56 is light 58, represented by arrows.

Figure 5:
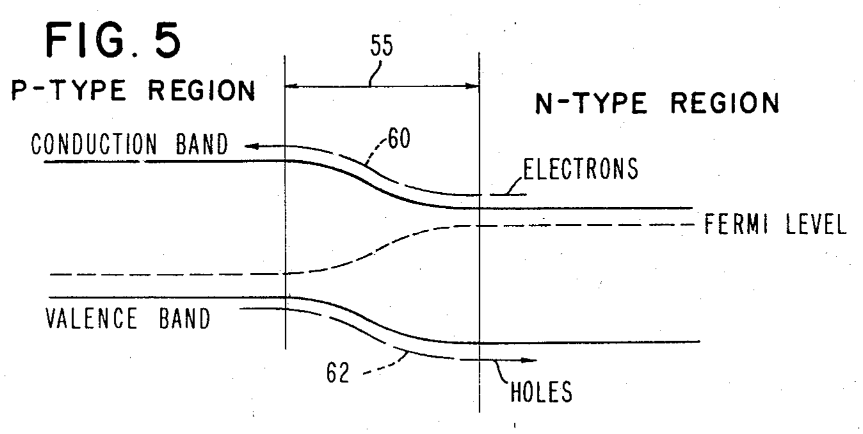
FIG. 5 is a graphical representation of the band structure of a forward biased p-n semiconductor junction showing the movement of electrons and holes across the junction.

The general nature of the band structure in a semiconductor element 50 (FIG. 4) with p-n junction 55 therein is illustrated in FIG. 5. Characteristically, electrons flow from a n-type region to the p-type region as indicated by arrow 60 and holes flow from the p-type region to tbe n-type as indicated by arrow 62.

Figure 6:
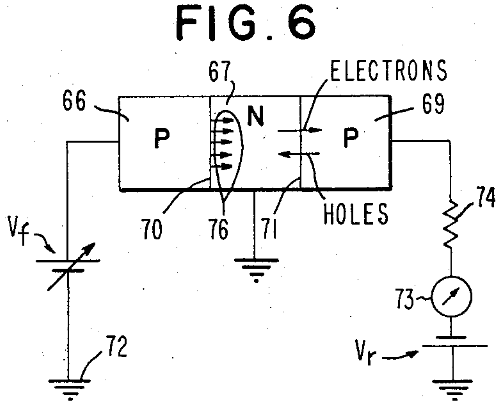
FIG. 6 illustrates an electro-optical transistor in which recombination radiation consisting of photons is propagating to the collector junction.

FIG. 6 is illustrative of an electro-optical transistor in which heterojunctions prepared by the practice of this invention are utilized. Transistor 64 has a p-type region 66, n-type region 67 and p-type region 69. Junction 70 is between regions 66 and 67. Junction 71 is between regions 67 and 69. The positive terminal of potential source $V_f$ is connected to p-type region 66 and its negative terminal is connected to ground 72. The negative terminal of voltage source $V_f$ is connected via current meter 73 and load resistor 74 to p-type region 69. Its positive terminal is connected to ground. N-type region 67 is connected to ground. Recombination radiation 76 emanating from p-n junction 70 causes electron-hole pairs at p-n junction 71. Collector current flowing in load resistor 74 is indicated by meter 73. When the output current is to be modulated, a suitable voltage is connected between regions 66 and 67.

EXPERIMENTS FOR INVENTION

Liquid phase epitaxy according to the practice of this invention was used for preparing layers of $Ga_{1-x}Al_xAs$ on GaAs substrates. Extremely homogeneous layers of about 100 microns in thickness were grown resulting in highly efficient visible light emitting diodes. The epitaxial layers were obtained by a modified solution growth technique. The formation of p-n junctions was obtained by means of counterdoping during the cooling cycle. External quantum efficiencies up to 1.2 percent were measured at room temperature on diodes having the peak emission at 1.7 eV. By epoxy coating those diodes, the efficiency increased up to 3.3 percent. The turn-on-time for the light emission at 300°K was measured to be 60 ns.

Values for the external quantum efficiency at 300°K of up to 1.2 percent were observed on diodes having a peak emission around 1.70 eV. When coated with an index of refraction matching material, e.g., epoxy, external quantum efficiencies of up to 3.3 percent were measured for the same set of diodes under d.c. operation.

Formation of the p-n junctions was obtained in a single step cooling cycle at a controllable distance from the physical boundary of the GaAs substrate by means of counterdoping the solution. To prepare the $Ga_{1-x}Al_xAs$ system, the vertical apparatus of FIG. 1 as used. An $Al_2O_3$ crucible was loaded with Ga, Al, excess GaAs and an n or p-type dopant (Te or Zn). The epitaxial layers were deposited on GaAs substrate wafers mounted on a graphite holder with faces perpendicular to the < 100 > direction. High purity forming gas was passed through the system during growth. The layers were deposited during the cooling cycles which varied from 1,000°C to 860°C. For this temperature range, the compositions of the layers were found to depend on the ratio of Ga to Al in the melt and the cooling rate. By removing the graphite holder from the melt at the end of the cooling cycle, the growth was terminated. The regrown layers were normally of a thickness of 100 microns and extremely homogeneous in their composition. The variation in the Ga-Al ratio was found to be less than 2 percent of any given value $x$ over the whole cross-section of the epitaxial layer. If high quantum efficiencies are required, it is desirable to stay within a composition range of direct band gap material. For human visual sensitivity the most efficient emission should be as close to the band gap energy as possible for which shallow impurity levels given by Zn and Te are desirable. All optical and electrical properties discussed herein were obtained from diodes containing Zn and Te. These diodes had all four sides cleaved and were shaped to parallelepiped.

Figure 7A:
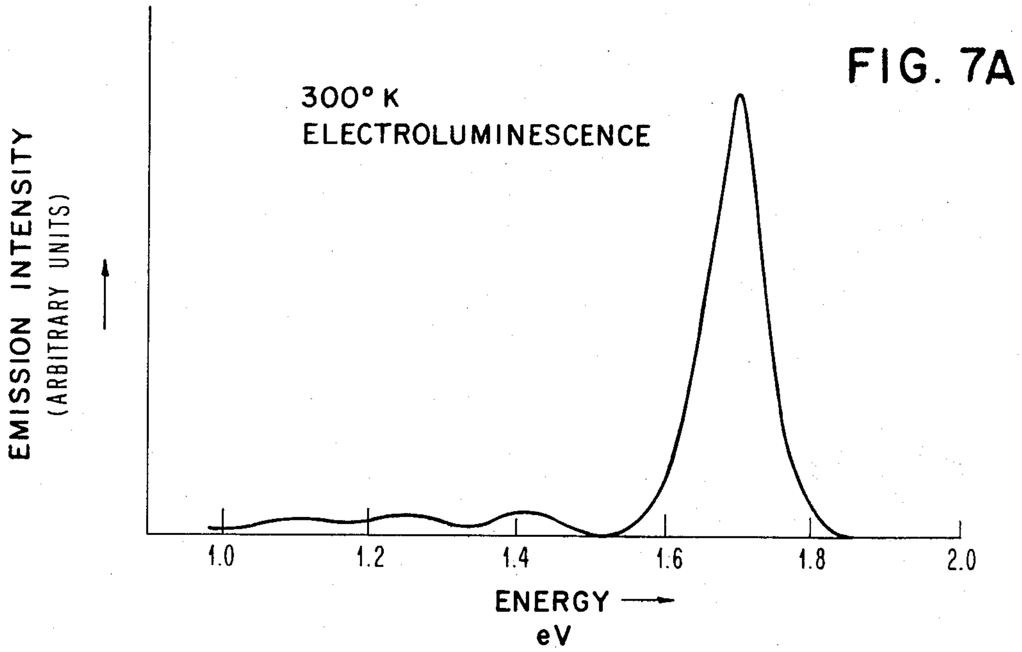
FIG. 7 presents in FIGS. 7A and 7B graphs of emission intensity versus energy from a p-n junction in $Ga_{1-x}Al_xAs$ at 77°K and 300°K.
Figure 7B:
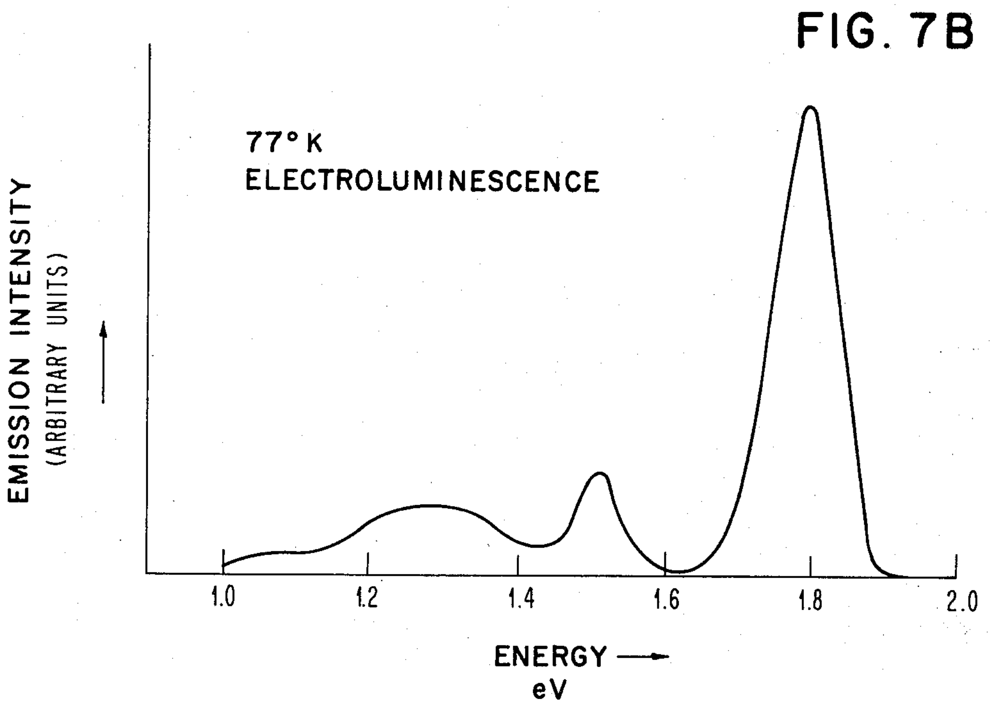

FIG. 7 gives the spectral distribution for a typical set of diodes, as measured with a PbS cell. At 300°K, about 86 percent of the externally observable photons are concentrated in a high energy line of about 90 meV width, its peak centered at 1.7 eV. With decreasing temperature, the emission intensity increases. For the most efficient diodes, an increase by a multiplication factor of approximately 8 was observed when the temperature was decreased from 300°K (FIG. 7A) to 77°K (FIG. 7B). At 77°K the relative intensity of the low energy emission becomes somewhat more enhanced. Approximately 26 percent of the total number of photons are distributed over essentially two lines with peak energies of 1.5 eV and 1.28 eV. The dominant high energy line has a peak of 1.79 eV. At room temperature, the emission intensity is superlinear for current densities less than $50 A/cm^2$. For higher values it becomes linear. At 77°K, a practically linear behavior was found for current densities varying from $0.05\ A/cm^2$ to $50\ A/cm^2$. At both 300°K, i.e., room temperature, and 77°K it was found that the diode current depended on applied voltage in the following relation:

$$I = I_o \exp\ (eV/\beta kT)$$

with $\beta \approx 2$.

Figure 8:
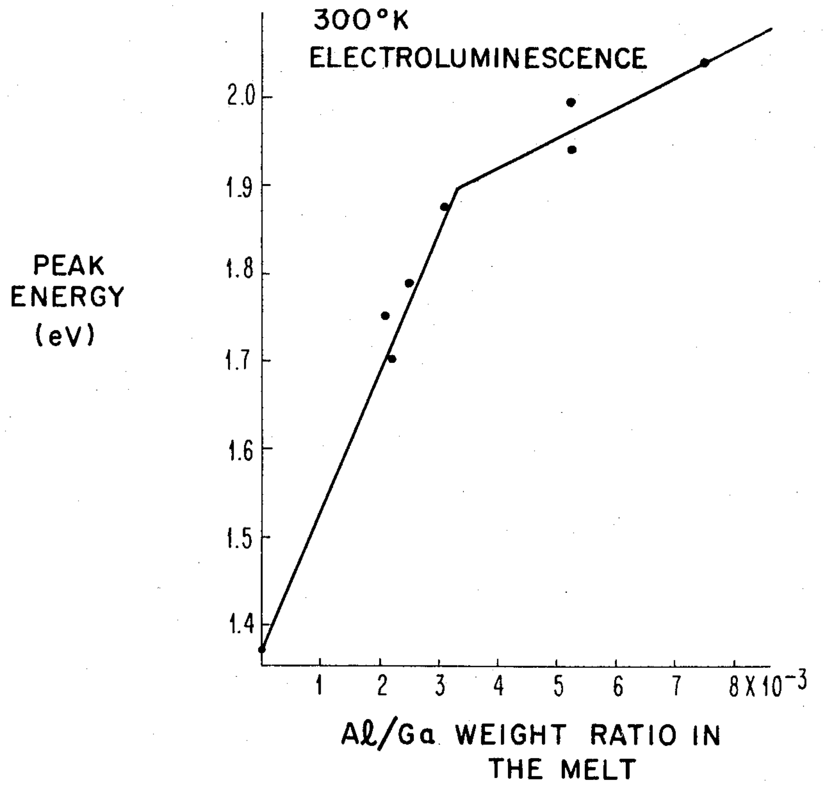

The composition of the epitaxial layers depended on cooling rate and melt composition. The nature of the graph in FIG. 8 suggests that the distribution coefficient, i.e., the concentration ratio, of one component, e.g., Al, in the solid to Al in the liquid, does not vary with composition of the melt for a constand cooling rate. FIG. 8 gives the peak energy of the near edge line as a function of the Al/Ga ratio in the melt for constant cooling rate. There is a kink in the data at about 1.9 eV indicating the transition from direct to indirect semiconductor material.

THEORY OF INVENTION

Figure 9:
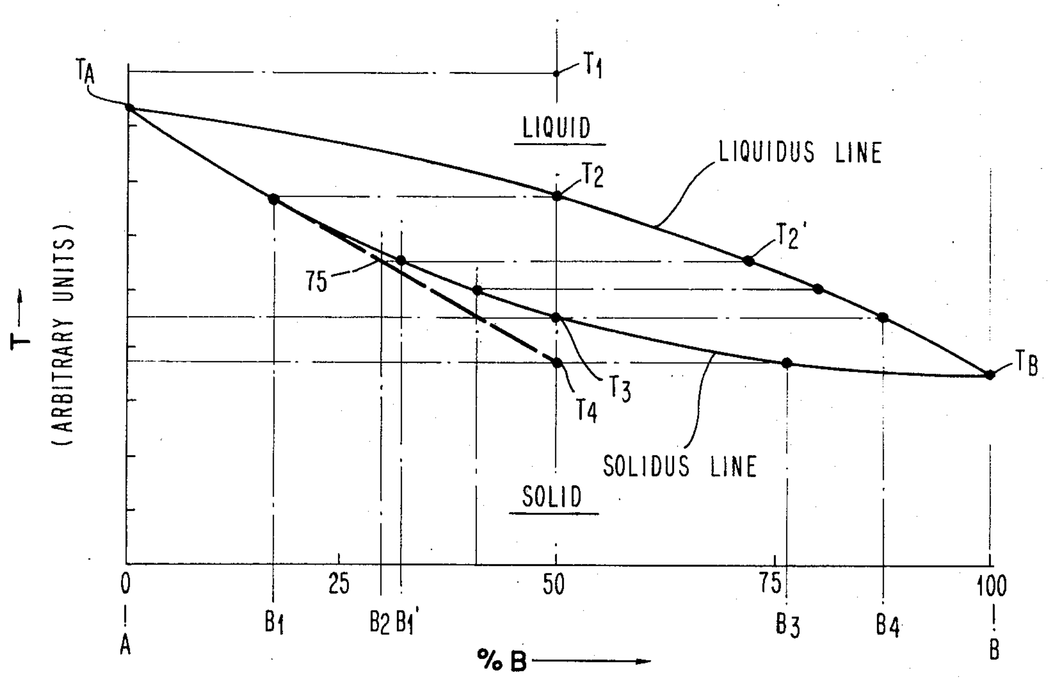
FIG. 9 is a line drawing of a hypothetical binary phase diagram useful for presenting both practice and theory of this invention.

Extrapolation of the nature of solids formed according to hypothetical binary phase diagram presented in FIG. 9, i.e., component A being AlAs and component B being GaAs, it is expected that a solid of $Ga_{1-x}Al_xAs$ prepared by liquid phase epitaxy would have changes in composition. Contrary to this premise, it has been discovered for the practice of this invention that for semiconductor ternary compounds, the crystalline layers have essentially uniform composition. Further, it is not possible to predict from binary phase diagram considerations the composition under non-equilibrium rapid cooling condition.

In any procedure for growing a crystalline layer by liquid phase epitaxy, there is a lowering of the temperature of a melt including at least one component, e.g., A, and sometimes including two or more components, e.g., A + B. At least one solid phase must be present in equilibrium with a liquid phase. The principles of liquid phase epitaxy will be discussed now with reference to FIG. 9 which is a hypothetical binary phase diagram maintained at a constant pressure.

Case I There are present solid of pure component A and liquid of pure component A. Since component A has a single melting temperature at $T_A$, by cooling the system to $T_A$ and inserting a single crystal of A and then cooling the system below $T_A$, a single crystal of A forms from the entire system.

Case II There are present both components, A and B, in proportion 50 percent A and 50 percent B.

a. For the equilibrium situation, a solid crystal begins growing at $T_2$ at an initial concentration of $B_1$, where $B_1$ signifies a particular percentage. As the temperature is lowered, the liquid changes composition along the liquidus line and the solid changes composition along the solidus line. When a temperature $T_3$ is attained, the liquid phase disappears and there is present a solid with uniform composition 50 percent A + 50 percent B.

b. Practically, the solid phase cannot change composition infinitely fast. As the solid phase grows, it exhibits variations in composition, which is commonly termed "coring". At temperature $T_2$, the solid starts to grow at a composition $B_1$. As the temperature is lowered, the solid formed at temperature $T_2$ does not change composition. However, the new solid which forms at temperature $T_2'$ has composition $B_1'$. The average composition of all the solids present at this temperature $T_2'$ is at $B_2$. Actually, as cooling occurs the average composition changes along the dashed line 75, and the new solid being formed changes composition along the solidus line. In order to have an average composition of the solid at 50 percent B, some solid must be present with composition of greater than 50 percent B. Finally, the liquid phase disappears at temperature $T_4$ when solid with composition $B_3$ forms.

c. For the circumstance of essentially infinitely fast freezing, at temperature $T_2$, solid with composition $B_1$ forms, and the liquid adjacent to the solid builds up very fast in composition to $B_4$. Finally, growth of the solid proceeds at temperature $T_3$ at a composition 50 percent B until of the liquid has solidified.

Case III For the three phase equilibrium requisite for preparation of a ternary compound, e.g., $Ga_{1-x}Al_xAs$, according to the practice of this invention there must be present one liquid, i.e., liquid Ga + Al + As, and two solids, i.e., solid GaAs and solid $Ga_{1-x}Al_xAs$.

What is claimed is:

1. Method for preparing a given composition of a structure comprising a crystalline semiconductor multicomponent compound with more than two components and with a continuous range of compositions by liquid phase epitaxy comprising the steps of:
   - providing an equilibrium liquid solution at a given temperature comprised of the components of a semiconductor multicomponent compound with more than two components and with a continuous range of compositions;
   - providing a crystalline solid substrate in said liquid in equilibrium with said liquid at said given temperature and having a lattice constant compatible with the lattice constant of said crystalline compound; and
   - producing a given composition of said compound within said continuous range of compositions by
     - cooling the system of said liquid and said solid at a given programmed and predetermined rate to induce liquid phase epitaxial growth of said crystalline semiconductor multicomponent compound with more than two components on said crystalline substrate whose structural composition is said given composition as predetermined by said cooling rate.

2. Method for preparing a given composition of a single crystalline semiconductor multicomponent ternary compound structure with more than two components and with a continuous range of compositions by liquid phase epitaxy comprising the steps of:

providing an equilibrium liquid solution at a given temperature comprised of the components of a semiconductor multicomponent compound with more than two components and with a continuous range of compositions;

providing a crystalline solid substrate in said liquid in equilibrium with said liquid at said given temperature and having a lattice constant compatible with the lattice constant of said crystalline compound; and cooling the system of said liquid and said solid at a given programmed and variable rate to induce liquid phase epitaxial growth of said crystalline semiconductor multicomponent compound with more than two components on said crystalline substrate whose composition is determined by said cooling rate.

3. Method of forming a layer of graded composition comprising the steps of:

providing an equilibrium liquid solution at a given temperature of the components of a semiconductor ternary compound with a continuous range of compositions;

providing a solid single crystalline substrate having a lattice constant which is compatible with the lattice constant of said ternary compound in equilibrium with said liquid at said given temperature; and cooling the system of said liquid and said solid at a variable rate to grow by liquid phase epitaxy a layer of said semiconductor ternary compound of graded composition on said substrate.

4. Method as set forth in claim 3 wherein said ternary compound is a III–V semiconductor compound.

5. Method according to claim 3 wherein said variable cooling rate consists of one cooling rate followed by another different cooling rate to form a heterojunction in said semiconductor ternary compound layer.

6. Method according to claim 5 wherein said components of said ternary compound are Ga, Al and As and said heterojunction consists of a layer of $Ga_{1-x}Al_xAs$ adjacent a layer of GaAs.

7. Method according to claim 6 wherein said one cooling rate is selected to be from 0.5°C to 0.1°C per minute for forming said layer of $Ga_{1-x}Al_xAs$ and said another different cooling rate is selected to be greater than 10°C per minute for forming said layer of GaAs.

8. Method for preparing a given composition of a structure comprising a crystalline semiconductor multicomponent compound with more than two components and with a continuous range of compositions by liquid phase epitaxy comprising the steps of:

providing an equilibrium liquid solution at a given temperature comprised of the components of a semiconductor multicomponent compound with more than two components and with a continuous range of compositions;

providing a crystalline solid substrate in said liquid in equilibrium with said liquid at said given temperature and having a lattice constant compatible with the lattice constant of said crystalline compound; and producing a given composition of said compound within said continuous range of compositions by cooling the system of said liquid and said solid at a given programmed and predetermined and fixed rate to induce liquid phase epitaxial growth of said crystalline semiconductor multicomponent compound with more than two components on said crystalline substrate whose structural composition is said given composition as predetermined by said cooling rate.

9. Method according to claim 8 wherein said crystalline semiconductor compound is a ternary compound.

10. Method according to claim 9 wherein:

said ternary compound is $Ga_{1-x}Al_x$ As;

said substrate is Ga As;

said liquid solution contains Ga, Al, As and excess GaAs solid with the Al/Ga weight ratio being in the range of approximately $2\times10^{-3}$ to $8\times10^{-3}$;

said substrate is at temperature during growth of said $Ga_{1-x}Al_x$ As compound in the range of approximately 1,000°C to 860°C; and said cooling rate is in the range of approximately 0.1°C to 10°C per minute.

11. Method as set forth in claim 9 wherein said ternary compound is a III–V semiconductor compound.

12. Method according to claim 9 wherein said ternary compound is single crystalline structure.

13. Method according to claim 12 wherein said single crystalline structure is $Ga_{1-x}Al_xAs$, and said Al/Ga weight ratio in said liquid solution is less than 0.5.

14. Method according to claim 13 wherein said programmed and predetermined and fixed cooling rate is selected to be from 0.5°C to 1°C per minute.

15. Method of forming a p-n junction in a single crystalline structure of a semiconductor ternary compound with a continuous range of compositions comprising the steps of:

providing an equilibrium liquid solution at a given temperature comprised of the components of a ternary compound with a continuous range of compositions;

providing a single crystalline solid substrate in said liquid in equilibrium with said liquid at said temperature and having a lattice constant compatible with the lattice constant of said single crystalline structure;

adding uniformly a first semiconductor dopant to said liquid of one conductivity type;

producing a first layer of said compound having a first given composition within said continuous range of compositions by cooling the system of said liquid and said solid at a given predetermined and fixed rate to grow by liquid phase epitaxy said layer of said first conductivity type on said substrate;

adding uniformly to said doped liquid a second semiconductor counter dopant of opposite conductivity type to said first dopant; and producing a second layer of said compound having a second given composition within said continuous range of compositions by cooling said counter doped system of said liquid and said solid at said given rate to established by liquid phase epitaxy a p-n junction in a single crystalline semiconductor structure of said ternary compound.

16. Method as set forth in claim 15 wherein said ternary compound is a III–V semiconductor compound.

17. Method according to claim 15 wherein said p-n junction is electroluminescent.

18. Method according to claim 17 wherein said single crystalline ternary compound is $Ga_{1-x}Al_xAs$ and said first dopant is Te for n-type conductivity and said second dopant is Zn for p-type conductivity, and said Al/Ga weight ratio in said liquid solution is less than 0.5.

19. Method according to claim 18 wherein said predetermined and fixed cooling rate is selected to be from 0.5°C to 1°C per minute.

* * * * *